United States Patent [19]

Hashimoto

[11] 4,339,674
[45] Jul. 13, 1982

[54] TRIGGER CIRCUIT
[75] Inventor: Masaru Hashimoto, Ayase, Japan
[73] Assignee: Tokyo Shibaura Denki Kabushiki Kaisha, Japan
[21] Appl. No.: 186,769
[22] Filed: Sep. 12, 1980
[30] Foreign Application Priority Data
  Sep. 19, 1979 [JP] Japan .................. 54-119235
[51] Int. Cl.³ .......................... H03K 5/153
[52] U.S. Cl. ..................... 307/362; 307/355
[58] Field of Search ........... 307/350, 362, 355, 356, 307/354, 530, 290
[56] References Cited
U.S. PATENT DOCUMENTS
3,988,595 10/1976 Eatock ................. 307/362
4,013,898 3/1977 Makino ................ 307/362
4,210,830 7/1980 Fukahori .............. 307/362

FOREIGN PATENT DOCUMENTS
53-17029 6/1978 Japan .
53-29268 8/1978 Japan .

Primary Examiner—John Zazworsky
Attorney, Agent, or Firm—Finnegan, Henderson, Farabow, Garrett & Dunner

[57] ABSTRACT

A trigger circuit comprises first, second and third transistors whose emitters are connected in common to a constant current source, a current mirror having input and output terminals connected respectively to the collectors of the second and third transistors, a diode connected between the collector of the first transistor and the input terminal of the current mirror, and a switching transistor whose base and collector are connected respectively to the output terminal of the current mirror and the collector of the first transistor. The bases of the first and second transistors are connected in common to a first input terminal, while the base of the third transistor is connected to a second input terminal. A trigger signal is applied between the first and second input terminals. The diode and switching transistor are on and off respectively in one of two stable states of the trigger circuit, and are off and on respectively in the other. The threshold voltage levels of the circuit depend on the mirror ratio of the current mirror and the geometric dimensions of the first, second and third transistors.

4 Claims, 3 Drawing Figures

F I G. 3
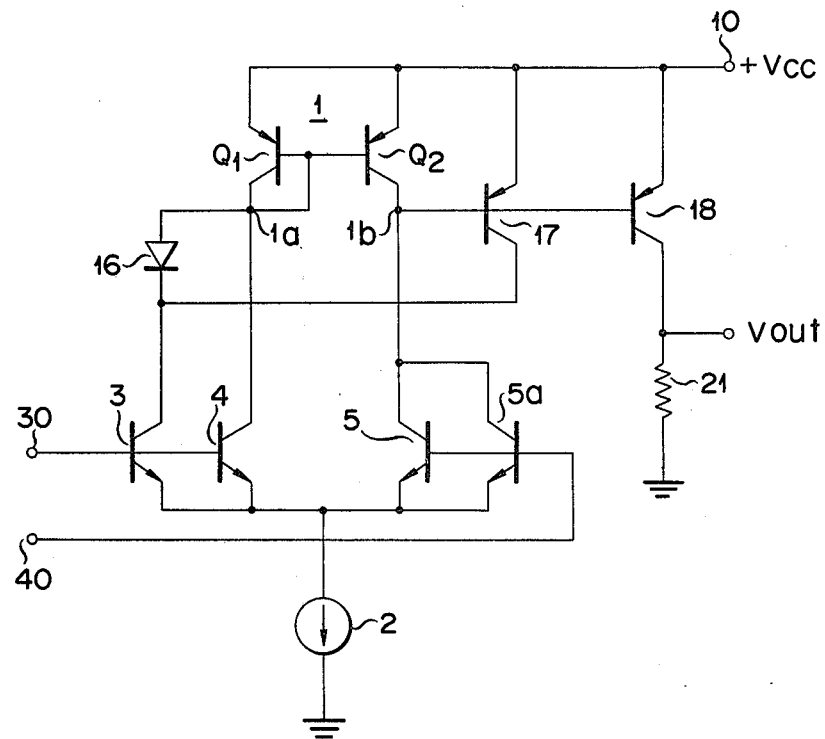

TRIGGER CIRCUIT

BACKGROUND OF THE INVENTION

This invention relates to a trigger circuit having upper and lower threshold voltage levels.

Presently, trigger circuits are used in a wide variety of fields, and are expected to fulfill various requirements according to several objects. In U.S. Pat. No. 3,514,633, there is disclosed a trigger circuit having two cross-coupled transistor pairs and capable of independently adjusting two threshold levels with high accuracy. In this trigger circuit, each transistor pair is formed of an input transistor and a current-switching transistor of different conductivity types. One input transistor is so connected as to receive a trigger signal at its base, while the other input transistor has its base connected to reference potential. The emitters of these input transistors are connected to a common constant current source via their respective emitter resistors. The current-switching transistors of the two transistor pairs have their respective bases connected to the collector of the input transistor of each corresponding pair and their collectors cross-coupled to the emitter of the input transistor of each other pair.

In this circuit, the first and second paired transistors are on and off respectively in one of two stable states, and are off and on in the other. Accordingly, input impedance makes a remarkable change when the circuit is switched from one stable state to the other. Moreover, the threshold levels of the aforementioned circuit depend on the values of the emitter resistors and current supplied from the constant current source. Accordingly, if the current supplied from the constant current source changes with supply voltage, the threshold levels will also change therewith.

SUMMARY OF THE INVENTION

An object of this invention is to provide a trigger circuit capable of eliminating the drawbacks of the prior art trigger circuits.

In a trigger circuit according to this invention, the emitters of first, second and third transistors of the same conductivity type are connected in common to a constant current source, the bases of the first and second transistors are connected in common to a first input terminal, and the base of the third transistor is connected to a second input terminal. A trigger signal is applied between the first and second input terminals. The collectors of the second and third transistors are connected to input and output terminals of a current mirror, respectively. A switching element is connected between the collector of the first transistor and the input terminal of the current mirror, and is switched on and off by a current detecting means which is connected to the output terminal of the current mirror and responds to relationship between the magnitudes of the output current of the current mirror and the collector current of the third transistor.

According to a preferred embodiment of the invention, the switching element is a diode whose anode and cathode are connected respectively to the input terminal of the current mirror and the collector of the first transistor, and the current detecting means is a switching transistor of a conductivity type opposite to that of the first to third transistors whose base and collector are connected respectively to the output terminal of the current mirror and the collector of the first transistor.

The diode and switching transistor are on and off respectively in one of two stable states, and are off and on respectively in the other. The threshold voltage levels of the trigger circuit depend on the mirror ratio of the current mirror, i.e. the ratio of the output current to the input current of the current mirror, and the geometric dimensions of the first, second and third transistors.

If the emitter areas of the first, second and third transistors are A, B and C respectively, and the mirror ratio is n, the circuit is switched from the first stable state to the second stable state when a potential at the second input terminal slightly exceeds a potential at the first input terminal plus $$\frac{kT}{q} \ln \frac{n \cdot (A + B)}{C},$$

and is switched from the second stable state to the first stable state when a potential at the second input terminal falls slightly below a potential at the first input terminal plus $$\frac{kT}{q} \ln \frac{n \cdot B}{C}.$$

The substantial hysteresis width of the trigger circuit is $$\frac{kT}{q} \ln \frac{A + B}{B}.$$

In this circuit, therefore, the threshold voltage levels may easily be controlled by adjusting the current mirror ratio and the geometric dimensions of the transistors. Independent of the current values of the transistors, the threshold voltage levels will never be influenced by variations of supply voltage. Further, since the first, second and third transistors are not required to be switched on or off when the circuit is switched from one stable state to the other, a remarkable change of input impedance can be avoided.

BRIEF DESCRIPTION OF THE DRAWINGS

FIG. 3 shows a modified example of the trigger circuit of FIG. 2.

DETAILED DESCRIPTION OF THE PREFERRED EMBODIMENTS

Figure 1:
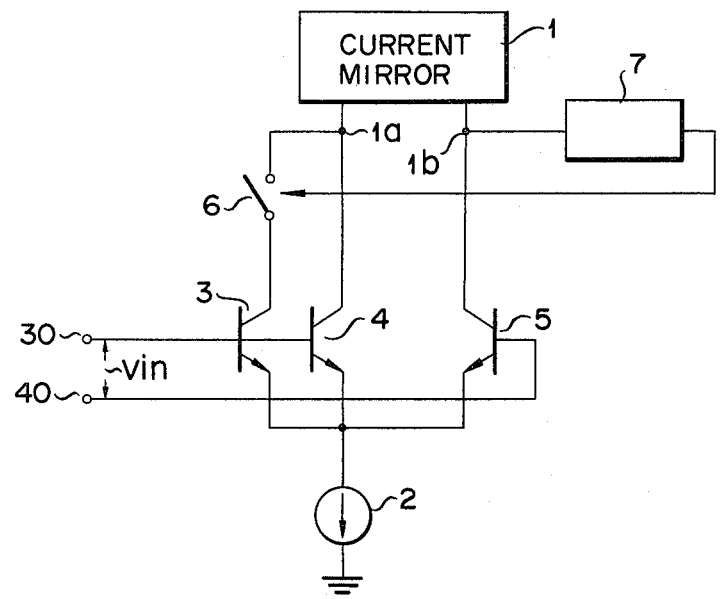
FIG. 1 shows a basic arrangement of a trigger circuit according to this invention.

Referring now to FIG. 1 which schematically shows a trigger circuit according to this invention, reference numeral 1 designates a current mirror having an input terminal 1a and an output terminal 1b. In a normal state, the magnitude of output current at the output terminal 1b has a given ratio to the magnitude of input current at the input terminal 1a which depends on the current mirror.

Numerals 3, 4 and 5 designate NPN-type transistors whose emitters are connected in common to a constant current source 2. The bases of the transistors 3 and 4 are connected to a first input terminal 30, while the base of the transistor 5 is connected to a second input terminal 40. A trigger signal Vin is applied between the first and second input terminals 30 and 40. The collectors of the second and third transistors 4 and 5 are directly coupled to the input and output terminals 1a and 1b of the current mirror 1, respectively. The collector of the first transistor 3 is connected to the input terminal 1a of the current mirror 1 through a switching means 6. The switching means 6 is switched on and off by a means 7 which, connected to the output terminal 1b of the current mirror 1, responds to the relationship between the magnitudes of the output current of the current mirror 1 and the collector current of the transistor 5. When the output current of the current mirror 1 is greater than the collector current of the transistor 5, a difference current flows into the means 7, thereby causing the means 7 to turn the switching means 6 on. When the output current of the current mirror 1 is smaller than the collector current of the transistor 5, on the other hand, the difference current flows out of the means 7, thereby turning the switching means 6 off.

Figure 2:
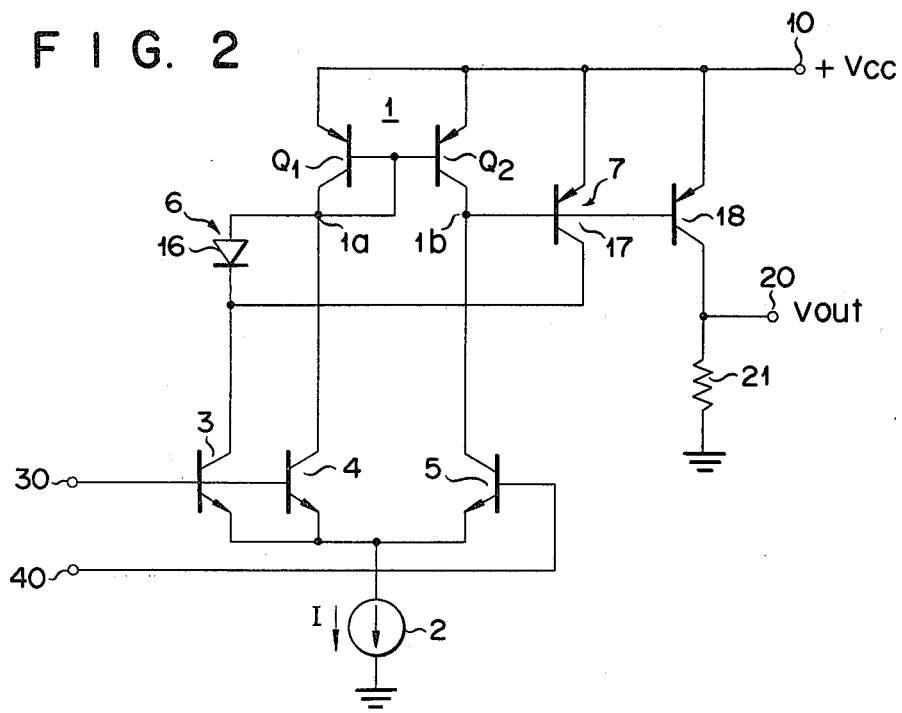
FIG. 2 shows a practical arrangement of the trigger circuit of the invention.

FIG. 2 shows a practical arrangement of the trigger circuit of FIG. 1. In this arrangement, the current mirror 1 is formed of PNP-type transistors Q1 and Q2. For the switching means 6, there is used a diode 16 whose anode is connected to the input terminal 1a of the current mirror 1, i.e. the collector of the diode-connected transistor Q1, and whose cathode is connected to the collector of the first transistor 3. For the means 7 to switch on and off the switching element 6 in response to the relationship between the magnitudes of the output current of the current mirror 1 and the collector current of the third transistor 5, moreover, there is used a PNP-type transistor 17 whose base is connected to the output terminal 1b of the current mirror 1, i.e. the collector of the transistor Q2, whose emitter is connected to a power source terminal 10 which is connected with the emitters of the current mirror transistors Q1 and Q2, and whose collector is connected to the collector of the first transistor 3. Further provided is an output means for producing output voltage which is composed of a PNP-type transistor 18 having its base connected to the output terminal 1b of the current mirror 1, its emitter connected to the power source terminal 10, and its collector connected to an output terminal 20, and a resistor 21 connected between the output terminal 20 and circuit ground.

Now there will be described the operation of the trigger circuit of FIG. 2. Suppose that the transistors 3, 4 and 5 have the same geometric dimension. Then, if the base potentials of the transistors 3, 4 and 5 are equal, the collector currents of these transistors will be also equal. Also, suppose that the current mirror transistors Q1 and Q2 have the same geometric dimension. Then, in the normal state, the ratio between the input current at the input terminal 1a of the current mirror 1 and the output current at the output terminal 1b, i.e. the mirror ratio, becomes substantially 1.

When the transistors 17 and 18 are not conducting, the collector current of the transistor 3 is supplied from the current mirror 1 via the diode 16. In this state, if the base potentials of the transistors 3, 4 and 5 are equal, then the collector currents of all these transistors 3, 4 and 5 will be equal. Namely, if the value of current supplied from the constant current source 2 is I, then the collector currents of the transistors 3, 4 and 5 are $\frac{1}{3}$I each. Accordingly, the input current of the current mirror 1, that is the collector current of the transistor Q1, is $\frac{2}{3}$I. Thus, although the current mirror 1 intends to provide a current value of $\frac{2}{3}$I for its output current or the collector current of the transistor Q2, a reverse current flows into the base of the transistors 17 and 18 to keep these transistors 17 and 18 off since the collector current of the transistor 5 is $\frac{1}{3}$I. Actually, however, no reverse current flows into the bases of the transistors 17 and 18, and the transistor Q2 is saturated. In this state, the current mirror 1 is deviated from the given mirror ratio.

The trigger signal Vin applied between the input terminals 30 and 40 is represented by the difference between a potential $V_{30}$ at the terminal 30 and a potential $V_{40}$ at the terminal 40, and, if $V_{30}$ is taken as a reference, is given by $$Vin = V_{40} - V_{30}$$

When $V_{40}$ rises to cause the collector current of the transistor 5 to exceed $\frac{1}{2}$I in some measure, the transistors 17 and 18 are quickly switched on. The switching operations of the transistors 17 and 18 are performed as follows.

When the collector current of the transistor 5 slightly exceeds $\frac{1}{2}$I, the sum of the collector currents of the transistors 3 and 4, i.e. the collector current of the transistor Q1, becomes a little less than $\frac{2}{3}$I. Accordingly, the transistor Q2 operates so as to provide a collector current a little less than $\frac{2}{3}$I due to current mirror effect. As a result, a difference is produced between the collector currents of the transistors Q2 and 5. Since the collector current of the transistor 5 is greater than the collector current of the transistor Q2, the base currents of the transistors 17 and 18 are supplied as a difference current to the transistor 5. At the same time, the collector current of the transistor 17 is supplied to the collector of the transistor 3. Consequently, the current supplied to the collector of the transistor 3 via the diode 16 is reduced by a portion corresponding to the collector current of the transistor 17. This leads to a reduction of the collector current of the transistor Q1 and hence of the collector current of the transistor Q2. Thus, the sum of the base currents of the transistors 17 and 18 are further increased by the decrement of the collector current of the transistor Q2. As soon as the collector current of the transistor 5 becomes a little greater than the collector current of the transistor Q2 or the output current of the current mirror 1 by such positive feedback action, the diode 16 is switched off, and the transistors 17 and 18 are switched on. As the transistor 18 is turned on, the potential at the output terminal 20 is switched from ground level to $+V_{CC}$ level.

As mentioned above, the circuit of this invention is switched from a first stable state to a second stable state when the collector current of the transistor 5 becomes a litle greater than $\frac{1}{2}$I. The relationship between $V_{40}$ and $V_{30}$ at the moment when the circuit is switched from the first stable state to the second stable state may be given as follows:

$$V_{40} = V_{30} + \frac{kT}{q} \ln 2.$$

where k is Boltzmann's constant, T is absolute temperature, and q is electronic charge. Namely, when $V_{40}$ exceeds $V_{30}$ by a level slightly larger than $$\frac{kT}{q} \ln 2,$$

the circuit is switched from the first stable state (off state) to the second stable state (on state).

While the diode 16 is off, all the collector current of the transistor Q1 is supplied to the transistor 4. When $V_{40}$ falls slightly below $V_{30}$ in this state, the collector current of the transistor 4 is increased, and the collector current of the transistor 5 is decreased. The increase of the collector current of the transistor 4 results in increases of the input and output currents of the current mirror 1. The difference between the decreased collector current of the transistor 5 and the increased output current of the current mirror 1 is supplied as a reverse current to the bases of the transistors 17 and 18, thereby switching off these transistors. As a result, the circuit is switched from the second stable state to the first stable state.

As described above, the threshold levels of the trigger circuit of FIG. 2, that is, the upper and lower threshold levels of $V_{40}$ with respect to $V_{30}$, are substantially given by $$\frac{kT}{q} \ln 2$$

and 0, respectively. Independent of the magnitudes of the collector currents of the transistors, the threshold levels will never be influenced by variations of supply voltage. Since the transistors 3, 4 and 5 are not required to be switched on or off when the circuit is switched from one stable state to the other, a remarkable change of input impedance can be avoided.

According to this invention, the upper and lower threshold levels and hysteresis width can be controlled by properly adjusting the geometric dimensions of the transistors 3, 4 and 5 and the mirror ratio of the current mirror 1. Here let it be supposed that the current mirror 1 has the ratio between the input and output currents of n, and that the transistors 3, 4 and 5 have emitter areas A, B and C, respectively.

When the transistors 17 and 18 are off, the collector currents I1 and I2 of the transistors Q1 and Q2 may be given respectively by $$I1 = A \cdot Is \cdot \exp\left(\frac{q \cdot V_{BE4}}{kT}\right) + B \cdot Is \cdot \exp\left(\frac{q \cdot V_{BE4}}{kT}\right)$$

$$= (A + B)Is \cdot \exp\left(\frac{q \cdot V_{BE4}}{kT}\right)$$

$$I2 = C \cdot Is \cdot \exp\left(\frac{q \cdot V_{BE5}}{kT}\right)$$

where Is is reverse saturation current, $V_{BE4}$ is the base-to-emitter voltage of the transistors 3 and 4, and $V_{BE5}$ is the base-to-emitter voltage of the transistor 5.

Since the mirror ratio is n, the transistors 17 and 18 are switched from off to on when the collector current I2 of the transistor 5 slightly exceeds a value n times as large as the sum I1 of the collector currents of the transistors 3 and 4. In this state, it follows that $$V_{40} - V_{30} = V_{BE5} - V_{BE4}$$

$$= \frac{kT}{q} \ln \frac{I2}{C \cdot Is} - \frac{kT}{q} \ln \frac{I1}{(A + B) \cdot Is}$$

$$= \frac{kT}{q} \ln \frac{n(A + B)}{C}$$

Namely, the transistors 17 and 18 are switched on when $V_{40}$ surpasses $V_{30}$ by a level slightly exceeding $$\frac{kT}{q} \ln \frac{n(A + B)}{C}.$$

When the collector current of the transistor 5 becomes a little smaller than the value n times as large as the sum of the collector currents of the transistors 3 and 4, that is, the input current of the current mirror 1, with the transistors 17 and 18 on and hence with the diode 16 off, the transistors 17 and 18 are switched from on to off. This state may be given by $$V_{40} - V_{30} = \frac{kT}{q} \ln \frac{nB}{C}$$

In other words, the transistors 17 and 18 are switched from on to off when $V_{40}$ falls slightly below $$V_{30} + \frac{kT}{q} \ln \frac{nB}{C}.$$

Further, the hysteresis width is given by $$\frac{kT}{q} \ln \frac{n(A + B)}{C} - \frac{kT}{q} \ln \frac{nB}{C} = \frac{kT}{q} \ln \frac{A + B}{B}$$

Thus, the upper and lower threshold levels may be controlled by adjusting the mirror ratio n and the ratio between the collector currents of the transistors 3, 4 and 5 by a conventional method. The method for adjusting the current ratio between the transistors varies with the structure of the transistors. Adjustment of emitter area ratio is a typical method for adjusting the collector current ratio between the transistors. This method is applied to vertical transistors. For lateral transistors, the adjustment of the collector current ratio is achieved by adjusting the peripheral length of the collectors of the transistors. The mirror ratio adjustment can also be made according to the emitter areas of the transistors.

The emitter area adjustment can be achieved also by a method shown in FIG. 3. That is, an additional transistor 5a may be connected in parallel with the transistor 5, for example. Where the transistors 5 and 5a have the same geometric dimensions, C in the foregoing equations is adjusted to 2C.

The trigger circuit of this invention is not limited to the illustrated embodiments. For the current mirror 1, there may be used a current mirror of an alternative configuration. As a simple modification of the diode 16, a diode-connected transistor may be utilized. The constant current source 2 may be replaced with a high resistance element. Where it is desired that the current gain β of the PNP-type transistors 17 and 18 should be made large, each of these transistors may be combined with an NPN-type transistor in a conventional manner to provide a composite PNP-type transistor. Specifically for the PNP-type transistor 17, for example, the collector, base and emitter of an NPN transistor are connected to the emitter of the transistor 17, the collector of the transistor 17, and the collector of the transistor 3, respectively. The base, emitter and collector of the composite PNP-type transistor thus constructed corresponds to the base of the transistor 17, the emitter of the transistor 17, and the emitter of the NPN-type transistor, respectively.

What is claimed is:

1. A trigger circuit comprising:

first, second and third transistors of the same conductivity type each having a base, emitter and collector, said bases of said first and second transistors being connected in common, said emitters of said first, second and third transistors being connected in common, and said common-connected bases of said first and second transistors and said base of said third transistor being connected respectively to first and second input terminals between which a trigger signal is applied;

a current source connected to said common-connected emitters of said first, second and third transistors;

a current mirror having an input terminal and an output terminal connected respectively to said collectors of said second and third transistors;

switching means connected between said input terminal of said current mirror and said collector of said first transistor; and means connected to said output terminal of said current mirror and said switching means for switching on and off said switching means in response to an output current of said current mirror and a collector current of said third transistor.

2. A trigger circuit according to claim 1, wherein said switching means includes a diode which is so connected as to allow a current to be supplied from said input terminal of said current mirror to said collector of said first transistor in an on state, and wherein said means for switching on and off said switching means includes a transistor having its base connected to said output terminal of said current mirror and its collector connected to said collector of said first transistor.

3. A trigger circuit according to claim 1, wherein said first, second and third transistors are of NPN-type, and said current mirror includes PNP-type transistors connected in a current mirror configuration.

4. A trigger circuit according to claim 2, wherein said transistor in said means for switching on and off said switching means is of PNP-type.

* * * * *